(12) United States Patent
Halsey

(10) Patent No.: US 10,958,083 B2
(45) Date of Patent: Mar. 23, 2021

(54) BATTERY PACK WITH REDUCED VOLTAGE VARIANCE

(71) Applicant: GE Aviation Systems Limited, Gloucestershire (GB)

(72) Inventor: Colin John Halsey, Cheltenham (GB)

(73) Assignee: GE Aviation Systems Limited, Gloucestershire (GB)

(*) Notice: Subject to any disclaimer, the term of this patent is extended or adjusted under 35 U.S.C. 154(b) by 409 days.

(21) Appl. No.: 15/898,239

(22) Filed: Feb. 16, 2018

(65) Prior Publication Data

US 2018/0241227 A1   Aug. 23, 2018

(30) Foreign Application Priority Data

Feb. 20, 2017  (GB) ...................................... 1702708

(51) Int. Cl.
*H02J 7/00* (2006.01)
*H01M 10/44* (2006.01)
(Continued)

(52) U.S. Cl.
CPC ......... *H02J 7/0026* (2013.01); *H01M 2/1077* (2013.01); *H01M 2/34* (2013.01); *H01M 2/348* (2013.01); *H01M 10/425* (2013.01); *H01M 10/441* (2013.01); *H01M 10/443* (2013.01); *H01M 10/482* (2013.01); *H01M 10/486* (2013.01); *H02J 7/0021* (2013.01);
(Continued)

(58) Field of Classification Search
CPC .................................................... H02J 7/0026
USPC ......................................................... 320/121
See application file for complete search history.

(56) References Cited

U.S. PATENT DOCUMENTS 4,061,955 A    12/1977  Thomas et al.
4,935,315 A    6/1990   Herrin
(Continued)

FOREIGN PATENT DOCUMENTS

CN    102412564 A    4/2012
CN    204167971 U    2/2015
(Continued)

OTHER PUBLICATIONS

Combined Search and Examination Report issued in connection with corresponding GB Application No. 1702708.7 dated Jul. 31, 2017.
(Continued)

*Primary Examiner* — Jerry D Robbins
(74) *Attorney, Agent, or Firm* — McGarry Bair PC

(57) ABSTRACT

In one aspect, there is disclosed a cell stack which can include cell modules connected in series to generate a stack operating voltage. The cell modules can include a battery cell in series with a series switch and include a shunt switch connected in parallel to the battery cell and the series switch. A stack monitor circuit can have a series control coupled to the series switch, a shunt control coupled to the shunt switch, and a battery cell monitor coupled to the battery cell for measuring a cell parameter from each cell module. Based on the measured cell parameter, the stack monitor circuit can select at least one cell module either to contribute to the stack operating voltage by closing the series switch and opening the shunt switch or to bypass the stack operating voltage by the opening the series switch and closing the shunt switch.

16 Claims, 5 Drawing Sheets

(51) Int. Cl.
  *H01M 10/48*    (2006.01)
  *H01M 2/34*     (2006.01)
  *H01M 2/10*     (2006.01)
  *H01M 10/42*    (2006.01)
  *H01M 10/0525*  (2010.01)
  *G01R 31/396*   (2019.01)

(52) U.S. Cl.
  CPC ....... *G01R 31/396* (2019.01); *H01M 10/0525* (2013.01); *H01M 2200/103* (2013.01)

(56) References Cited

U.S. PATENT DOCUMENTS

| | | | |
|---|---|---|---|
| 5,180,641 A | 1/1993 | Burns et al. | |
| 5,227,259 A | 7/1993 | Weaver et al. | |
| 5,258,244 A | 11/1993 | Hall et al. | |
| 5,650,240 A | 7/1997 | Rogers | |
| 5,898,239 A | 4/1999 | Kawam | |
| 5,898,291 A | 7/1999 | Hall | |
| 6,087,035 A | 7/2000 | Rogers et al. | |
| 6,599,655 B2* | 7/2003 | Johnson | B64G 1/425 320/116 |
| 6,700,766 B2 | 3/2004 | Sato | |
| 6,873,134 B2* | 3/2005 | Canter | H02J 7/0021 320/118 |
| 6,928,381 B2 | 8/2005 | Becker-Irvin et al. | |
| 8,154,253 B2* | 4/2012 | Omagari | G01R 31/3842 320/134 |
| 8,896,315 B1 | 11/2014 | Davies | |
| 9,005,788 B2 | 4/2015 | Zhu | |
| 9,368,983 B2 | 6/2016 | Stickelmaier et al. | |
| 2003/0042870 A1 | 3/2003 | You et al. | |
| 2012/0091964 A1* | 4/2012 | Vance | H01M 10/441 320/122 |
| 2012/0241144 A1 | 9/2012 | Chorian et al. | |
| 2012/0293128 A1 | 11/2012 | Kim et al. | |
| 2014/0184161 A1* | 7/2014 | Deal | H02J 7/0019 320/121 |
| 2015/0008931 A1* | 1/2015 | Sugeno | G01R 31/396 324/434 |
| 2015/0042283 A1* | 2/2015 | Camp | H02J 7/0019 320/121 |
| 2015/0115736 A1 | 4/2015 | Snyder | |
| 2015/0380952 A1 | 12/2015 | Brandt et al. | |
| 2016/0254576 A1 | 9/2016 | Burns | |

FOREIGN PATENT DOCUMENTS

| | | |
|---|---|---|
| CN | 104767248 A | 7/2015 |
| DE | 102009025211 A1 | 1/2010 |
| JP | 2013031247 A | 2/2013 |
| WO | 2013/015162 A1 | 1/2013 |
| WO | 2017/054049 A1 | 4/2017 |

OTHER PUBLICATIONS

Combined Search and Examination Report issued in connection with corresponding GB Application No. 1702708.7 dated Feb. 2, 2018.

Chinese Patent Office, Office Action re Corresponding Application No. 201810148403.9, dated Feb. 29, 2021. 11 pages, China.

* cited by examiner

BATTERY PACK WITH REDUCED VOLTAGE VARIANCE

BACKGROUND OF THE INVENTION

Battery packs can include one or more cell stacks configured in parallel and series combinations to achieve a desired operating voltage and a current capacity generally measured in amp-hours. Unfortunately, when one battery cell in the cell stack is failing, the stack operating voltage can drop below a minimum stack voltage for powering a load of the battery pack. Also, an increase in loading on the battery pack comprising healthy battery cells can drop the stack operating voltage below the minimum stack voltage due to the internal resistance of each battery cell. Additionally, a failure in one battery cell can lead to a runaway temperature increase that can cascade to cause a catastrophic failure in the entire cell stack.

One solution to individual cell failure is to monitor the temperature and/or voltage of the entire cell stack and send an indication of the condition of the battery pack to the user. However, the cell failure requires that the entire stack be replaced, causing a service interruption and a replacement cost. One solution to heavy loading of the battery pack is to boost the stack operating voltage so that it remains above the minimum stack voltage during heavy loads. However, biasing the stack operating voltage upwards can excessively increase the voltage during light loading and thereby cause a high voltage variance of the cell stack over all loading conditions.

U.S. Pat. No. 6,599,655 discloses a method of conditioning an individual battery cell in a cell stack one at a time by isolating the battery cell and powering the load from the remaining battery cells. However, there is no means provided to maintain a low voltage variance during conditioning and under varying load conditions.

SUMMARY OF THE INVENTION

In one aspect, there is disclosed a cell stack for a battery pack which can include a set of cell modules having a low terminal and a high terminal and connected in series to generate a stack operating voltage of the cell stack. A battery cell can be connected to one of the low or the high terminals and a series switch can be connected in series between the battery cell and the other of the low or the high terminals. A shunt switch can be connected in parallel to the battery cell and the series switch between the low and the high terminals. The cell stack can further include a stack monitor circuit having a series control coupled to the series switch and a shunt control coupled to the shunt switch. The stack monitor circuit can also include a battery cell monitor coupled to the battery cell and measuring a cell parameter from the battery cell. Based on the measured cell parameter, the stack monitor circuit can selectively configure at least one cell module either to contribute to the stack operating voltage by closing the series switch and opening the shunt switch in the at least one cell module, or to bypass the stack operating voltage by the opening the series switch and closing the shunt switch in the at least one cell module.

In another aspect, there is disclosed a method of reducing voltage variance in a stack operating voltage of a cell stack comprising two or more cell modules stacked in series. The method can include configuring an operating set of the cell modules to contribute to the stack operating voltage by closing a series switch and opening a shunt switch in each cell module of the operating set. The method can further include configuring a reserve set of the cell modules to bypass the stack operating voltage by the opening a series switch and closing a shunt switch in each cell module of the reserve set. The method can further include monitoring the stack operating voltage and the cell voltage of at least one of the two or more cell modules. If the stack operating voltage varies by an amount greater than a predetermined stack threshold, either at least one cell module in the reserve set can be configured to contribute to the stack operating voltage by closing the series switch and opening the shunt switch, or at least one cell module in the operating set can be configured to bypass the stack operating voltage by opening the series switch and closing the shunt switch.

In yet another aspect, there is disclosed a battery pack having a plurality of cell stacks where each cell stack can comprise a plurality of cell modules connected in series to generate a stack operating voltage of the cell stack.

DETAILED DESCRIPTION

Figure 1:
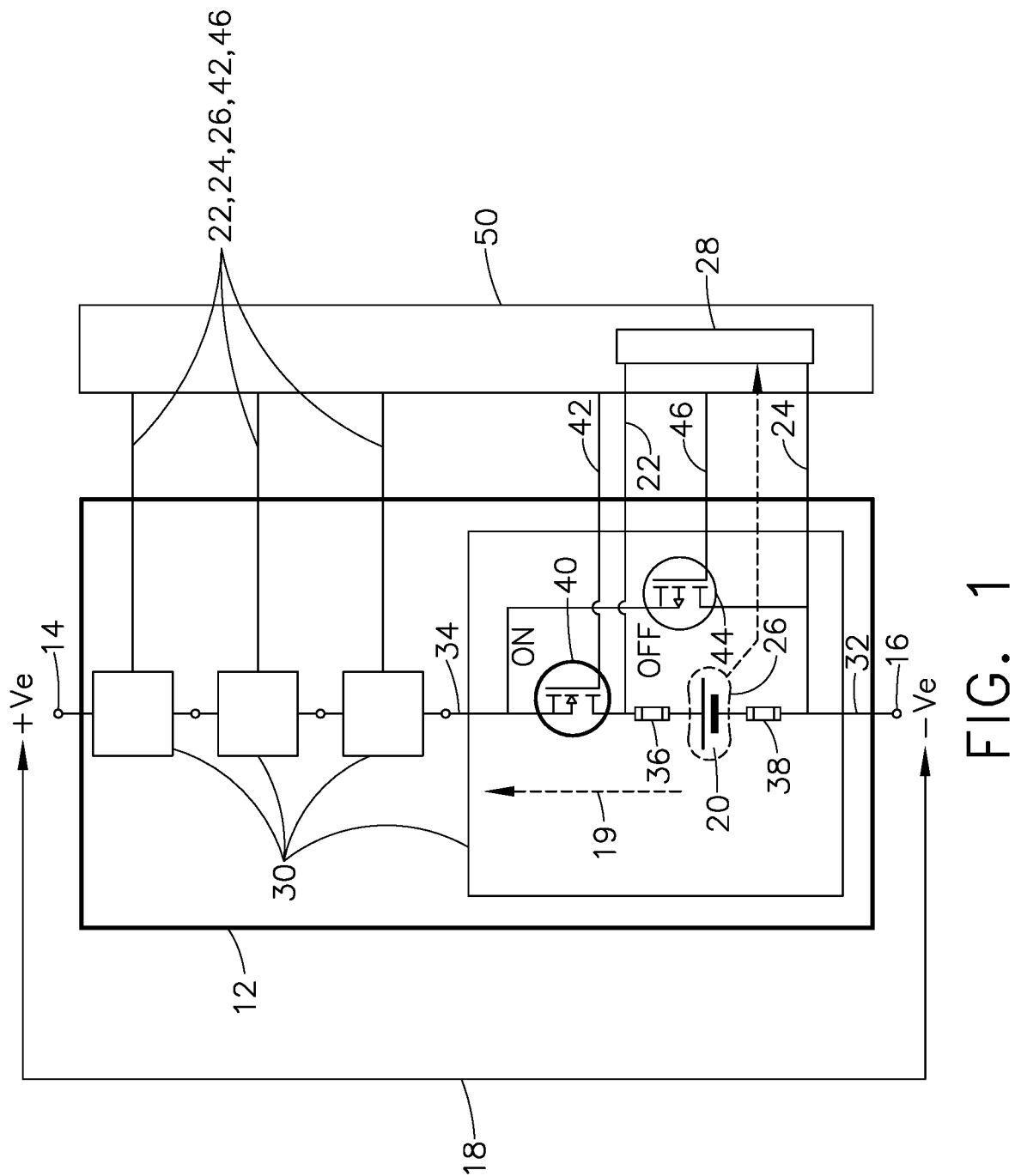
FIG. 1 illustrates a schematic of a cell module whose battery cell is selected to contribute to a cell stack, in accordance with various aspects described herein.

Referring to FIG. 1, in various aspects of the present disclosure, a cell stack 12 for a battery pack can comprise a set of cell modules 30 connected in series to generate a stack operating voltage 18 of the cell stack 12 between a stack anode 14 and a stack cathode 16. Each cell module 30 can include a battery cell 20 generating a cell voltage and connected in series with a series switch 40 controllable by a series control 42. The battery cell 20 can be connected to one of the low terminal 32 or the high terminal 34, and the series switch 40 can be connected to the other of the low 32 or the high 34 terminals. In FIG. 1, series switch 40 is shown with a thick circle outline indicated an ON (conductive) state, contributing the cell voltage to the stack operating voltage 18. The terminals 32 and 34 can define an electrical input or output of the cell module 30.

The battery cells 20 can be of lithium-ion composition which can be rated at about 3.3-3.6 volts, and any number of battery cells 20 can be concatenated in series to contribute to a stack operating voltage. For example, in FIG. 1, four Li-ion cells 20 can be concatenated to produce a stack operating voltage of about 13.2 to 14.4 volts, neglecting losses that can occur in other components that may be in series between the low terminal 32 and the high terminal 34 of the cell module 30. Alternately, the battery cell 20 can be of alkaline, nickel-metal-hydride, or some other composition known in the art. To form a higher voltage cell stack, such as a 270 volt cell stack, a larger number of battery cells 20 can be necessary. For example, assuming a design voltage of three volts for the battery cell 20, a total of 90 contributing battery cells 20 can be necessary to reach a stack operating voltage of 270 volts.

Continuing with FIG. 1, a shunt switch 44 can be connected in parallel to the battery cell 20 and the series switch 40 between the low 32 and the high 34 terminals to provide a path to bypass the battery cell 20. A shunt control 46 can control the shunt switch 44 to either conduct a stack current 19 of the cell stack 12 around the bypassed battery cell 20 or to be open circuited and allow the stack current 19 to flow through the battery cell 20 if the series switch is closed (ON). A stack monitor circuit 50 can couple to the series control 42 and the shunt control 46 to control the switching of the series switch 40 and the shunt switch 44, respectively. In FIG. 1, the shunt switch 44 is indicated with a thin circle indicating an OFF (open circuited) state.

One or both of the shunt switch 44 and the series switch 40 can be a semiconductor device such as a FET switch, a MOSFET, a bipolar junction transistor, or any other semiconducting switch known in the art. In FIG. 1, the series switch 40 can be an n-channel FET and the shunt switch 44 can be a p-channel FET. Each FET can include a zener diode across the drain-to-source (not shown). An on-resistance (not shown) of the semiconductor series or shunt switches can be minimized in order to minimize a reduction in the stack operating voltage 18 and to minimize heating within the cell stack 12. Additional cell modules 30 can be added to compensate for resistive losses due to the on-resistance of the semiconductor switch.

A first thermal fuse 38 can be interposed between a cathode of the battery cell 20 and the low terminal 32 and a second thermal fuse 36 can be interposed between an anode of the battery cell 20 and the high terminal 34 the cell module. The thermal fuses 36 and 38 can be configured to disconnect when a temperature in the battery cell exceeds a fusing threshold of the thermal fuses. The disconnecting of the thermal fuses 36 and 38 can entail a break such that the fuses becomes thermally isolated from the anode and the cathode, respectively. Generally, the thermal fuses 36 and 38 can be identical so that while in a closed-circuit condition, full electrical performance of the battery cell 20 is available to the cell stack 12 at a maximum cell temperature, while in an open-circuit (disconnected fuse) condition, the cell stack is fully isolated and protected from an overheating event in the battery cell 20, such as caused by a short circuit in the battery cell 20.

Alternatively, the thermal fuses 36 and 38 can be of different composition and can have different fusing thresholds to compensate for thermal conductivities or thermal risks that differ between the anode and cathode sides of the battery cell 20. The thermal fuses 36 and 38 can be a state-change type which disconnects from the anode and cathode. For example, lead or tin solder can provide a low-resistance contact during closed-circuit operation of the thermal fuses and can melt at a solder melting point, falling away from the anode and contact to create an open-circuit condition. Beneficially, the thermal fuses 36 and 38 protect the series switch 40 and other circuitry associated with the cell module 30 and circuitry of the cell stack 12 from an elevated temperature of a battery cell 20 that is failing.

Referring still to FIG. 1, the stack monitor circuit 50 can include a battery cell monitor 28 coupled to the battery cell 20 of the cell module 30 and can measure a cell parameter from the cell module 30. The battery cell monitor 28 can also measure the cell parameter from the battery cell 20. Based on the measured cell parameter, the stack monitor circuit 50 can selectively configure at least one cell module 30 either to contribute to the stack operating voltage 18 by closing the series switch 40 and opening the shunt switch 44 in the at least one cell module 30, or to bypass the stack operating voltage 18 by opening the series switch 40 and closing the shunt switch 44.

The cell voltage can be one possible cell parameter measured by the battery cell monitor 28 and can be determined as the difference between the voltages of an anode monitor 22 and a cathode monitor 24 of the battery cell 20. Based on the cell voltage, the stack monitor circuit 50 can selectively configure at least one cell module 30 to bypass the stack operating voltage 18 when the measured cell voltage falls below a voltage threshold value. The cell voltage of the battery cell 20 can fall below the voltage threshold value when the battery cell 20 has become depleted or discharged, which can be exacerbated by an increase in the demanded stack current 19. The cell voltage can be continuously monitored by the battery cell monitor 28 to determine if the battery cell 20 has been exhausted. The sampling of the anode voltage and cathode voltage can occur directly at the anode and cathode of the battery cell 20, or can occur at a sample located separated from the anode or cathode, such as being separated from the anode or cathode by the thermal fuses 36 and 38.

The cell module 30 can also include a cell sensor 26 coupled to the battery cell 20 and providing one or more cell parameters to the battery cell monitor 28. In one aspect, the cell sensor 26 can provide a cell temperature of the battery cell 20 to the battery cell monitor 28 and the stack monitor circuit can selectively configure the cell module 30 to bypass the stack operating voltage 18 when the measured cell temperature rises above a temperature threshold value. For example, the cell temperature may rise above the temperature threshold that indicates a faulty or overheating battery cell. The cell sensor 26 can also monitor one or more other cell parameters such as vibration, shock, pressure, a chemical constituency, an electrical signal, or any other parameter indicating a condition of the battery cell. The cell sensor can be physically adjacent to or integrated with the battery cell.

In various aspects not shown, the battery cell monitor 28 can monitor or record performance metrics that determine whether a given battery cell should contribute to or bypass the stack operating voltage 18. For example, the battery cell monitor 28 can include tracking a voltage discharge profile over time and determined from the anode monitor 22, the cathode monitor 24, and the cell sensor 26 whether the battery cell 20 is weakening.

Figure 2:
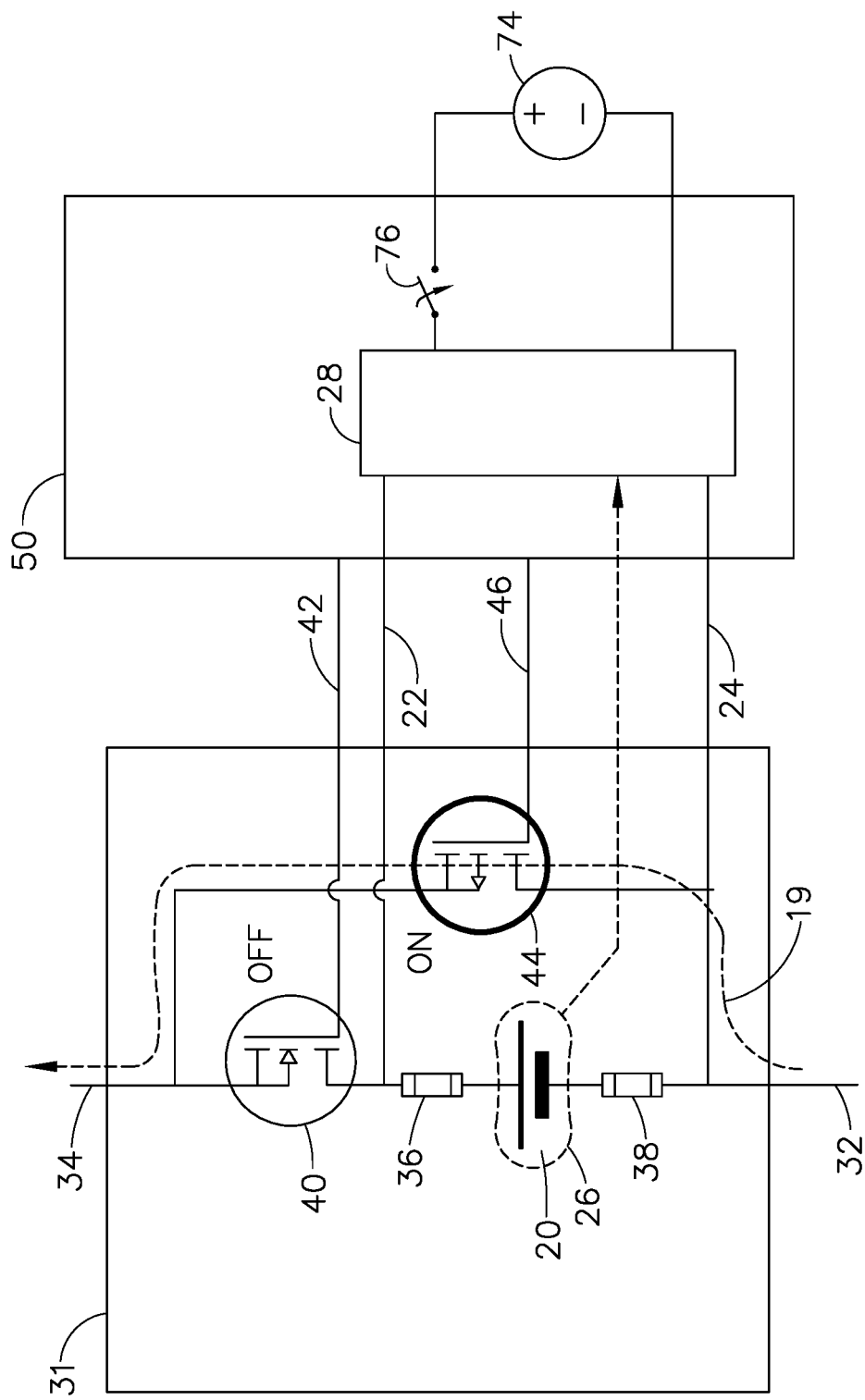
FIG. 2 illustrates a schematic of the cell module of FIG. 1 in bypass mode and configured for charging or conditioning, in accordance with various aspects described herein.

Referring now to FIG. 2, in various aspects of the present disclosure, a cell module 31 can bypass the stack operating voltage by the stack monitor circuit 28 turning off series switch 40 and turning on shunt switch 44, diverting stack current 19 around the battery cell 20. The stack monitor circuit 50 can include routing a charger 74 to the battery cell 20 through a charger switch 76 and the battery cell monitor 28 when the cell module 31 is bypassed. The anode monitor 22 and cathode monitor 24 lines can be used to charge the battery cell 20 as well as to monitor the cell voltage. Alternatively, charging lines (not shown) can be positioned directly at the anode and cathode of the battery cell 20. Beneficially, the bypassing of the cell module 31 allows its battery cell 20 to be charged while maintaining the stack operating voltage 18 using other cell modules not bypassed.

The charger 74 can also be included in the stack monitor circuit 50. The charger can be electrically floated, referenced to the low terminal 32 so that each cell module 30 in the cell stack 12 can utilize the charger 74. The cell stack 12 can be a backup power source for an electrical system (not shown)

and the power for operating the charger 74 can come from the electrical system when the cell stack 12 is not being used or is lightly loaded. The stack monitor circuit 50 can also include conditioning circuitry (not shown) to discharge or condition the battery cell 20 when necessary. In one aspect, the power for operating the conditioning circuitry can be supplied by the cell stack 12 itself under lightly loaded conditions as an act of self-repair.

Figure 3:
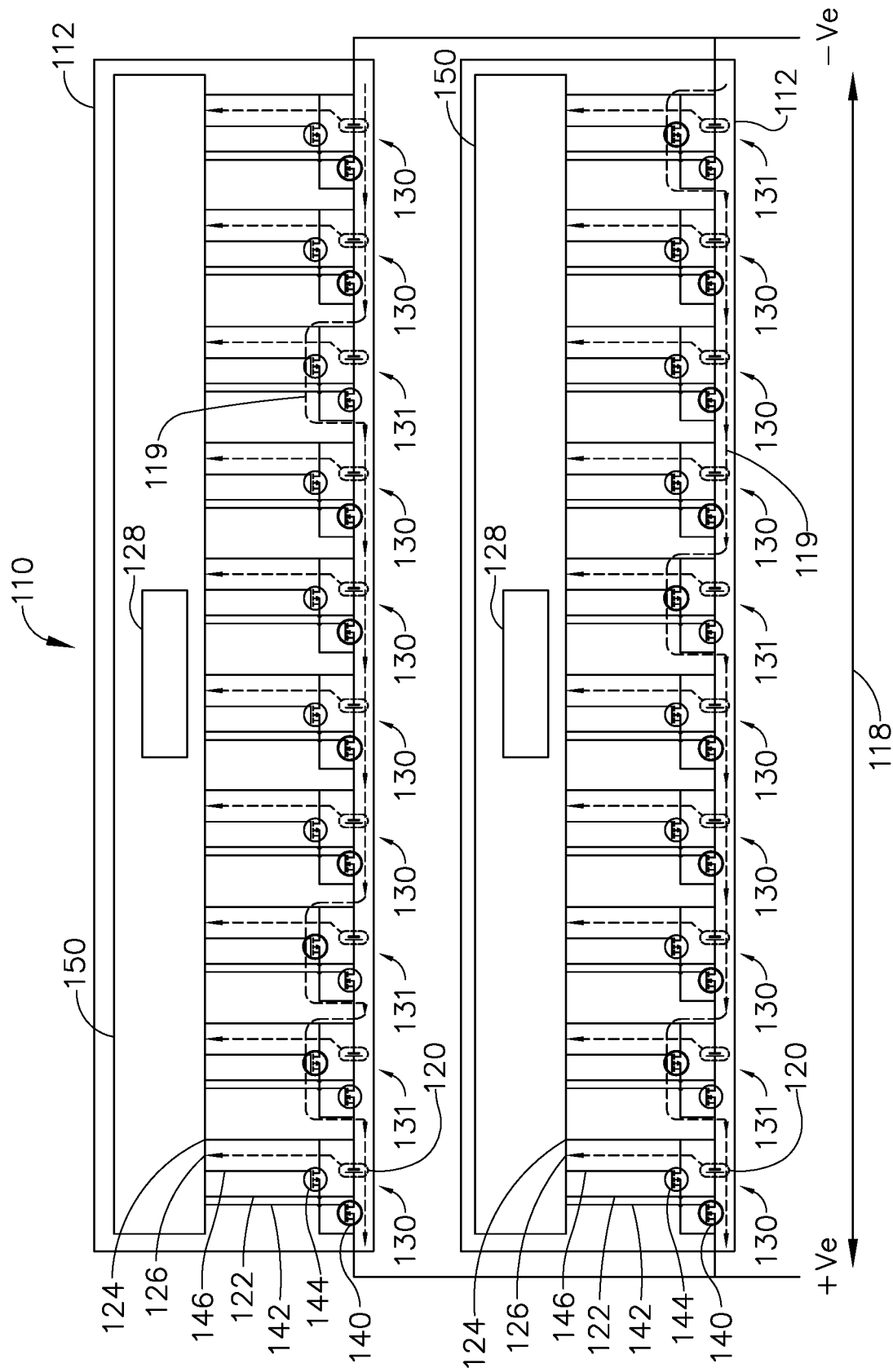
FIG. 3 illustrates two cell stacks with a combination of selected and bypassed cell modules of FIGS. 1 and 2, in accordance with various aspects described herein.

Referring to FIG. 3, in an aspect of the disclosure, an operating set of cell modules 130 can be configured to contribute to a stack operating voltage 118 of a cell stack 112 by closing a series switch 140 and opening a shunt switch 144 in each cell module 130 of the operating set. A reserve set of cell modules 131 can be configured to bypass the stack operating voltage 118 of the cell stack 112 by opening the series switch 140 and closing the shunt switch 144 in each cell module 131 of the reserve set. Two cell stacks 112 can be combined in parallel to form a battery pack 110.

The stack operating voltage 118 of the cell stack 112 and the cell voltage of a battery cell 120 of each cell module 130 and 131 can be monitored by a battery cell monitor 128 within a stack monitor circuit 150 and through an anode monitor 122 and a cathode monitor 124 of each cell module 130 and 131. If the monitored stack operating voltage 118 varies by an amount greater than a predetermined stack threshold, either at least one cell module 131 can be selected to contribute to the stack operating voltage 118 or at least one cell module 130 can be set to bypass the stack operating voltage 118. By configuring the cell stacks 112 to select or bypass battery cells 20, the voltage variance of the stack operating voltage 118 can be reduced.

For example, a degradation in one or more cell modules 130 in the operating set can cause the stack operating voltage 118 to drop by more than the predetermined stack threshold of, for instance, one volt, and the stack monitor circuit 150 can then be configured to bypass the degraded cell module 130 and to select a cell module 131 in the reserve set to contribute to the stack operating voltage 118. In another example, exceeding the predetermined stack threshold can be determined by a change in a loading on the cell stack, where an increase or decrease in a current demanded by the loading can cause a change in the stack operating voltage exceeding the predetermined stack threshold. In a case of heavy loading on the cell stack, a 15% drop in the stack operating voltage 118 can occur and additional cell modules 131 can be selected to restore the stack operating voltage 118 to within the predetermined stack threshold.

In another aspect, the stack monitor circuit 150 can receive an indication that the loading on the cell stack 112 has changed such that the stack operating voltage 118 will vary by more than the predetermined stack threshold.

Beneficially, provisioning the cell stack 112 with a greater number of battery cells 20 than required to meet the stack operating voltage 118 under a nominal load condition, combined with monitoring the cell voltage and the stack operating voltage 118, can reduce voltage variance under conditions of cell failure or varied loading on the cell stack 112.

Continuing with FIG. 3, in various embodiments, each of the cell stacks 112 can include a stack monitor circuit 150. Optionally, the stack monitor circuit 150 for each of the two cell stacks 112 can be coupled to one another. By sharing stack monitor data on cell voltages between the two cell stacks, a common stack monitor circuit 150 can assign cell modules to the reserve set and to the selected set for both cell stacks in a way that equalizes stack operating voltages 118 between the two cell stacks 112 and further reduces voltage variance of the battery pack 110. Alternatively, the two cell stacks 112 can be monitored and controlled by one stack monitor circuit 150 (not shown).

One or more battery cells 120 of the bypassed cell modules 131 can be charged or conditioned by way of the battery cell monitor 128. The conditioning process can occur through the anode monitor and cathode monitor lines 122 and 124, respectively, and can include placing a discharge resistor (not shown) in series with the bypassed battery cell 120 to discharge the battery cell 120 during conditioning. The cell stack 112 can also include a vibration detector or a shock detector for predicting a failing cell condition for one or more cell module 130 and 131 in the cell stack 112.

Figure 4:
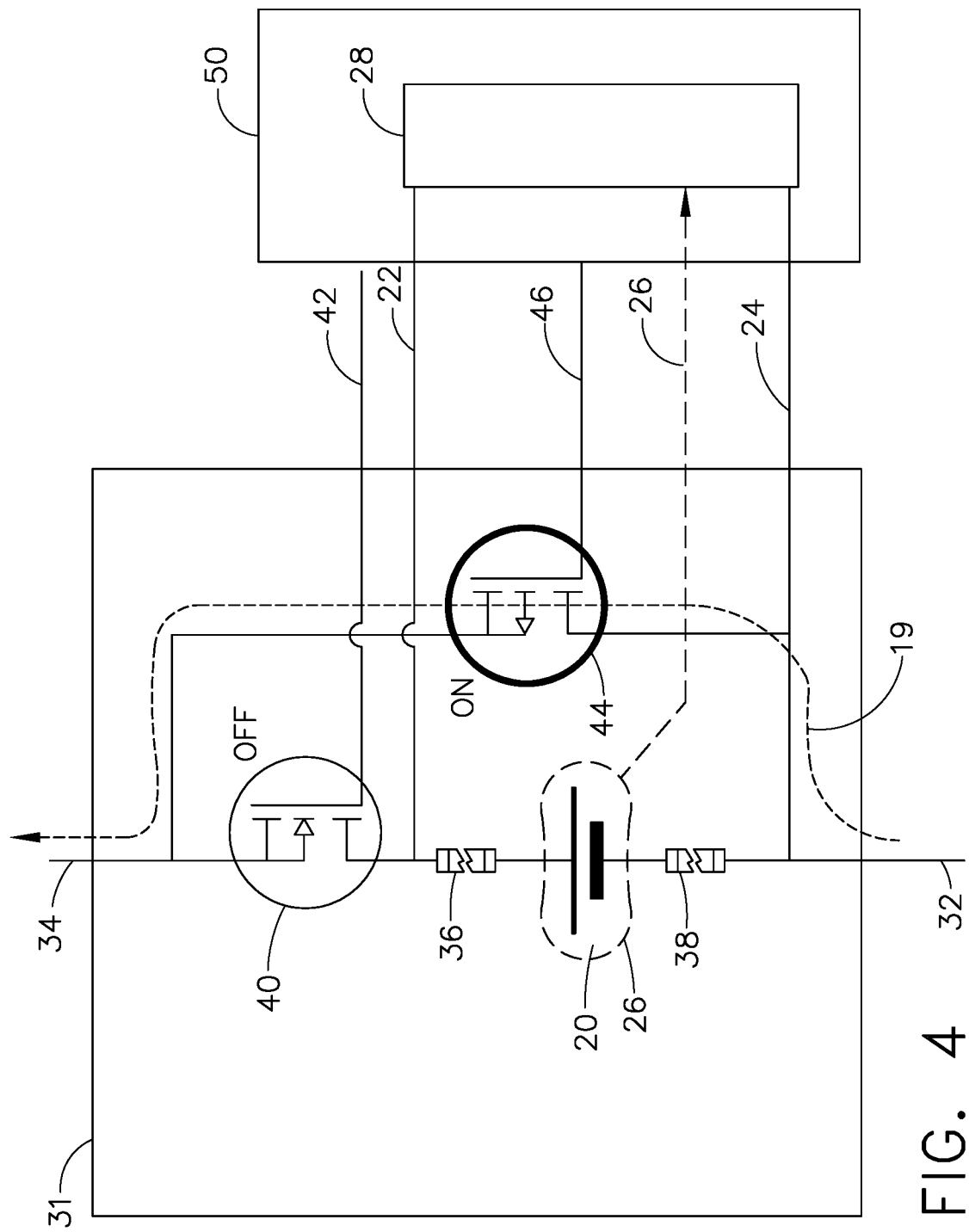
FIG. 4 is a schematic of the cell module of FIG. 2 thermally isolating the battery cell from the cell stack, in accordance with various aspects described herein.

Referring to FIG. 4, in an aspect of the disclosure, the thermal fuses 36 and 38 can disconnect to isolate the battery cell 20 from the rest of the cell module 31 when the temperature in the battery cell 20 exceeds a fusing threshold. The stack monitor circuit 50 can be configured to detect that one or both thermal fuses 36 and 38 have disconnected and can then bypass the battery cell 20 by closing the shunt switch 44 and opening the series switch 40. For example, an electrical change in the anode monitor line 22 can indicate that the thermal fuse 36 has blown (disconnected) and can trigger the battery cell monitor to set the cell module 31 to bypass mode.

The disconnecting of the thermal fuses 36 or 38 can be automatic such that the open-circuiting of fuses 36 and 38 happens automatically as a change in the physical state of the fuses 36 and 38. Alternatively, the disconnecting of fuses 36 or 38 can occur in response to the temperature in battery cell 20 exceeding the fusing threshold but requiring an external control such as an enable line or an external enabling element.

Figure 5:
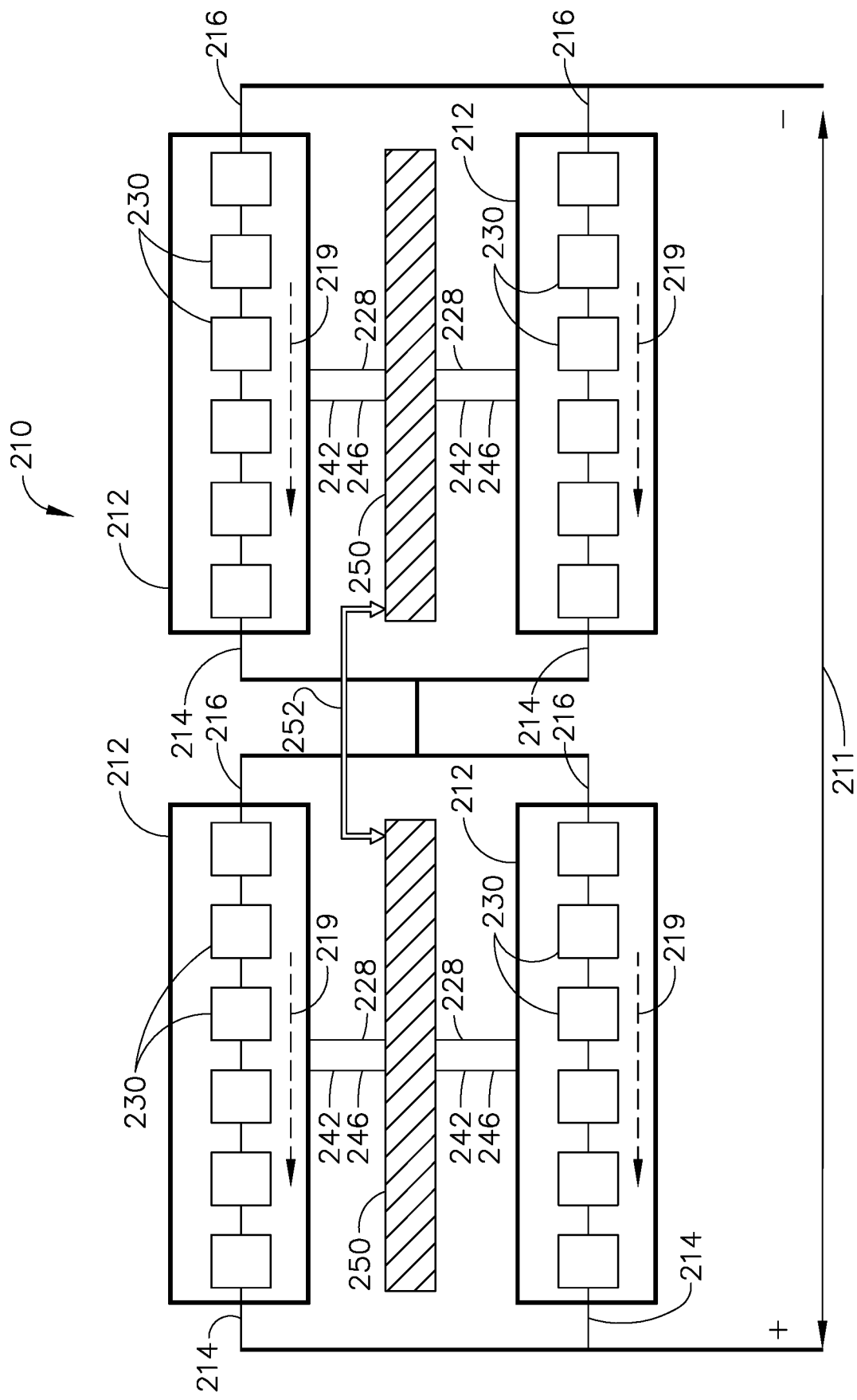
FIG. 5 is a schematic of four cell stacks in a parallel-series combination, in accordance with various aspects described herein.

FIG. 5, in an aspect of the disclosure, shows how four cell stacks 212 can be placed in a parallel-series combination to form battery pack 210, which can generate a stack current 219 and a pack voltage 211. Each cell stack 212 can have a stack anode 214 and a stack cathode 216. Each of two stack monitor circuits 250 can control two cell stacks 212 through a series control 242 and a shunt control 246 for each cell module 30.

Each stack monitor circuit 250 can have a battery cell monitor 228 to receive one or more cell parameters from one or more cell modules 230 reporting the condition of the battery cells. In addition, cell voltage (not shown) can be received by additional sense lines, such as an anode monitor, a cathode monitor, or a cell sensor. The two stack monitor circuits 250 can be coupled through monitor interconnect 252 for exchanging data on the condition of each battery cell and for coordinating which cell modules 230 to choose for the reserve set and/or which cell modules 230 to choose for the selected set for each cell stack 212. Additionally, each cell stack 212 can include its own stack monitor circuit 250.

Although the battery pack 210 in FIG. 5 is shown with six cell modules 230 per cell stack 212, each cell stack 212 can have any number of cell modules 230. More than two cell stacks 212 can be connected in parallel to increase a storage capacity of battery pack 210, and more than two cell stacks 212 can be connected in series to increase the pack voltage 211. Alternatively, each cell stack 212 can have its own stack monitor circuit 250.

Many other possible embodiments and configurations in addition to that shown in the above figures are contemplated by the present disclosure. To the extent not already described, the different features and structures of the various embodiments can be used in combination with each other as desired. That one feature cannot be illustrated in all of the embodiments is not meant to be construed that it cannot be, but is done for brevity of description. Thus, the various features of the different embodiments can be mixed and matched as desired to form new embodiments, whether or not the new embodiments are expressly described. Moreover, while "a set of" or "a plurality of" various elements have been described, it will be understood that "a set" or "a plurality" can include any number of the respective elements, including only one element. Combinations or permutations of features described herein are covered by this disclosure.

This written description uses examples to disclose embodiments of the disclosure, including the best mode, and also to enable any person skilled in the art to practice embodiments of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A cell stack for a battery pack, comprising:
    a set of cell modules, wherein cell modules included in the set of cell modules have a low terminal and a high terminal and are connected in series to an adjacent cell module to generate a stack operating voltage of the cell stack;
    a battery cell connected to one of the low or the high terminals;
    a series switch connected in series between the battery cell and the other of the low or the high terminals;
    a shunt switch connected in parallel to the battery cell and the series switch between the low and the high terminals; and
    a stack monitor circuit having a series control coupled to the series switch, a shunt control coupled to the shunt switch, and a battery cell monitor coupled to the battery cell;
    a first thermal fuse between the battery cell and the low terminal and a second thermal fuse between the battery cell and the high terminal, wherein the first and second thermal fuses are configured to disconnect when a temperature in the battery cell exceeds a fusing threshold;
    wherein the stack monitor circuit configures at least one cell module in the set of cell modules to bypass the stack operating voltage by opening the series switch and closing the shunt switch in the at least one cell module in response to the disconnecting of the first and second thermal fuses;
    wherein the battery cell monitor measures a cell parameter of the battery cell and, based on the measured cell parameter, the stack monitor circuit selectively configures the at least one cell module either to contribute to the stack operating voltage by closing the series switch and opening the shunt switch in the at least one cell module, or to bypass the stack operating voltage by opening the series switch and closing the shunt switch in the at least one cell module.

2. The cell stack of claim 1 wherein the stack monitor circuit charges the battery cell by way of the battery cell monitor when the at least one cell module bypasses the stack operating voltage.

3. The cell stack of claim 1 wherein the measured cell parameter is a cell voltage, and the stack monitor circuit selectively configures the at least one cell module to bypass the stack operating voltage when the measured cell voltage falls below a voltage threshold value.

4. The cell stack of claim 1 wherein the measured cell parameter is a cell temperature, and the stack monitor circuit selectively configures the at least one cell module to bypass the stack operating voltage when the measured cell temperature rises above a temperature threshold value.

5. The cell stack of claim 1 wherein the at least one cell module is a reserve cell that bypasses the stack operating voltage only until the stack monitor circuit configures at least one other cell module to bypass the stack operating voltage by the opening the series switch and closing the shunt switch in the at least one other cell module, whereupon the stack monitor circuit configures the at least one cell module to contribute to the stack operating voltage by closing the series switch and opening the shunt switch in the at least one cell module.

6. The cell stack of claim 1 further comprising a cell sensor coupled to the battery cell and providing the cell parameter to the battery cell monitor.

7. The cell stack of claim 1 further comprising a vibration detector for predicting a failing cell condition in the set of cell modules.

8. The cell stack of claim 1 wherein the battery cell is a lithium-ion battery.

9. The cell stack of claim 1 wherein the series switch and the shunt switch are semiconductor FET devices.

10. A battery pack having a plurality of cell stacks according to claim 1.

11. The battery pack of claim 10 wherein the stack monitor circuit in each cell stack is coupled to another stack monitor circuit.

12. The battery pack of claim 10 wherein at least one stack monitor circuit charges the battery cell when the at least one cell module bypasses the stack operating voltage.

13. A method of reducing voltage variance in a stack operating voltage of a cell stack in a battery pack having two or more cell modules stacked in series, the method comprising:
    configuring an operating set of the two or more cell modules to contribute to the stack operating voltage by closing a series switch and opening a shunt switch in each cell module of the operating set;
    configuring a reserve set of the two or more cell modules to bypass the stack operating voltage by the opening a series switch and closing a shunt switch in each cell module of the reserve set;
    monitoring the stack operating voltage and the cell voltage of at least one of the two or more cell modules; and
    in response to the stack operating voltage varying by an amount greater than a predetermined stack threshold, isolating at least one cell module by disconnecting at least one fuse, and in response to the disconnecting at least one fuse performing at least one of:
    configuring at least one cell module in the reserve set to contribute to the stack operating voltage by closing the series switch and opening the shunt switch in the at least one cell module; or
    configuring at least one cell module in the operating set to bypass the stack operating voltage by opening the series switch and closing the shunt switch in the at least one cell module.

14. The method of claim 13 further comprising sensing a condition of the battery cell in each cell module of the operating set wherein the condition is one of temperature or voltage.

15. The method of claim 13 further comprising charging the at least one cell module in the reserve set when the at least one cell module bypasses the stack operating voltage.

16. The method of claim 13 wherein exceeding the predetermined stack threshold is determined by a change in a loading on the cell stack.

\* \* \* \* \*